US012619159B2

(12) United States Patent
Ten Haaf et al.

(10) Patent No.: US 12,619,159 B2
(45) Date of Patent: May 5, 2026

(54) METHOD FOR MODELING MEASUREMENT DATA OVER A SUBSTRATE AREA AND ASSOCIATED APPARATUSES

(71) Applicant: ASML Netherlands B.V., Veldhoven (NL)

(72) Inventors: Gijs Ten Haaf, Valkenswaard (NL); Everhardus Cornelis Mos, Best (NL); Hans Erik Kattouw, Arnhem (NL); Ralph Brinkhof, Vught (NL)

(73) Assignee: ASML Netherlands B.V., Veldhoven (NL)

( * ) Notice: Subject to any disclaimer, the term of this patent is extended or adjusted under 35 U.S.C. 154(b) by 59 days.

(21) Appl. No.: 18/437,564

(22) Filed: Feb. 9, 2024

(65) Prior Publication Data

US 2024/0192610 A1      Jun. 13, 2024

Related U.S. Application Data

(63) Continuation of application No. PCT/EP2022/070828, filed on Jul. 25, 2022.

(30) Foreign Application Priority Data

Aug. 12, 2021      (EP) ..................................... 21191014

(51) Int. Cl.
G03F 7/00          (2006.01)
(52) U.S. Cl.
CPC .......... G03F 7/705 (2013.01); G03F 7/70633 (2013.01)
(58) Field of Classification Search
CPC .. G03F 7/705; G03F 7/70633; G03F 7/70525; G03F 7/70616; G03F 9/7092
See application file for complete search history.

(56) References Cited

U.S. PATENT DOCUMENTS 6,952,253 B2   10/2005 Lof et al.
7,184,853 B2 *   2/2007 Roberts ............... G03F 7/70425
                                                            700/121

(Continued)

FOREIGN PATENT DOCUMENTS

EP          3396457 A1   10/2018
EP          3882701 A1    9/2021

(Continued)

OTHER PUBLICATIONS

International Search Report issued in related International Application No. PCT/EP2022/070828, mailed Nov. 17, 2022 (3 pgs.).

(Continued)

*Primary Examiner* — Hung V Nguyen
(74) *Attorney, Agent, or Firm* — Finnegan, Henderson, Farabow, Garrett & Dunner LLP

(57) ABSTRACT

Disclosed is a method for determining a process correction for at least a first process of a lithographic process, comprising at least the first process performed on at least a first substrate using at least a first apparatus and a second process performed on at least said first substrate using at least a second apparatus, where a correction actuation capability of the first apparatus differs from the second apparatus, comprising: obtaining metrology data relating to said first substrate; modeling said metrology data using a first model, the model being related to said first apparatus; and controlling said first process based on the modeled metrology data; the modeling step and/or an additional processing step comprises distributing a penalty in a performance parameter across said first process and said second process such that the distributed penalties in the performance parameter are within their respective specifications of the performance parameter.

24 Claims, 3 Drawing Sheets

(56)                    References Cited

U.S. PATENT DOCUMENTS

| | | | |
|---|---|---|---|
| 10,331,040 B2 | 6/2019 | Hulsebos et al. | |
| 11,029,359 B2 * | 6/2021 | Honda | G01R 31/31835 |
| 11,682,570 B2 * | 6/2023 | Vukkadala | G03F 7/70616 |
| | | | 700/121 |
| 11,733,606 B2 * | 8/2023 | Theeuwes | G03F 1/70 |
| | | | 355/18 |
| 2012/0218533 A1 | 8/2012 | Lyulina et al. | |
| 2014/0356981 A1 | 12/2014 | Hubbard et al. | |
| 2018/0330999 A1 | 11/2018 | Lee et al. | |
| 2020/0043860 A1 | 2/2020 | Sugaya et al. | |
| 2020/0091015 A1 | 3/2020 | Sugaya et al. | |
| 2021/0175105 A1 | 6/2021 | Lin et al. | |

FOREIGN PATENT DOCUMENTS

| | | | | |
|---|---|---|---|---|
| TW | 202105071 A | 2/2021 | | |
| WO | WO-03052517 A2 * | 6/2003 | | H01J 37/3175 |
| WO | WO 2013017924 A2 | 2/2013 | | |

OTHER PUBLICATIONS

Felix Nelson M. et al: "Overlay Improvement Roadmap: Strategies for Scanner Control and Product Disposition for 5 nm overlay," Metrology, Inspection, and Process control for Microlithography XXV, Proc. of SPIE vol. 7971, 79711D © 2011 SPIE • CCC code: 0277-786X/11 • doi: 10.1117/12.879532 (7 pgs.).

* cited by examiner

METHOD FOR MODELING MEASUREMENT DATA OVER A SUBSTRATE AREA AND ASSOCIATED APPARATUSES

CROSS-REFERENCE TO RELATED APPLICATIONS

This application claims priority of International application PCT/EP2022/070828, filed on 25 Jul. 2022, which claims priority of EP application 21191014.6, filed on 12 Aug. 2021. These applications are incorporated herein by reference in their entireties.

FIELD

The present disclosure relates to processing of substrates for the production of, for example, semiconductor devices.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use radiation. The wavelength of this radiation determines the minimum size of features which can be formed on the substrate. Typical wavelengths currently in use are about 365 nm (i-line), about 248 nm, about 193 nm and about 13 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of about 193 nm.

Low-k1 lithography may be used to process features with dimensions smaller than the classical resolution limit of a lithographic apparatus. In such a process, the resolution formula may be expressed as $CD=k1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of a numerical aperture (NA,) a customized illumination scheme, use of one or more phase shifting patterning devices, optimization of the design layout such as optical proximity correction (OPC) in the design layout, or other methods generally defined as resolution enhancement techniques (RET). Additionally or alternatively, one or more tight control loops for controlling a stability of the lithographic apparatus may be used to improve reproduction of the pattern at low k1.

Effectiveness of the control of a lithographic apparatus may depend on characteristics of individual substrates. For example, a first substrate processed by a first processing tool prior to processing by the lithographic apparatus (or any other process step of the manufacturing process, herein referred to generically as a manufacturing process step) may benefit from (slightly) different control parameters than a second substrate processed by a second processing tool prior to processing by the lithographic apparatus.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

These distortions of the wafer grid are represented by measurement data associated with mark position. The measurement data are obtained from measurements of wafers. An example of such measurements are alignment measurements of alignment marks performed using an alignment system in a lithographic apparatus prior to exposure.

It would be desirable to improve modeling of these distortions.

SUMMARY

In some embodiments of the present disclosure, there is provided a method for determining a process correction for at least a first process of a lithographic process, said lithographic process comprising at least the first process performed on at least a first substrate using at least a first apparatus and a second process performed on at least said first substrate using at least a second apparatus, where a correction actuation capability of the first apparatus differs from the second apparatus, the method comprising: obtaining metrology data relating to said first substrate; modeling said metrology data using a first model, said first model being related to said first apparatus; and controlling said first process based on the modeled metrology data; wherein said modeling step and/or an additional processing step comprises distributing a penalty in a performance parameter across said first process and said second process such that the distributed penalties in the performance parameter for said first process and said second process are within their respective specifications of the performance parameter.

In some embodiments of the present disclosure, there is provided a computer program comprising program instructions operable to perform the method of the described above when run on a suitable apparatus, and associated processing apparatus and lithographic apparatus.

BRIEF DESCRIPTION OF THE DRAWINGS

Embodiments of the present disclosure will now be described, by way of example only, with reference to the accompanying schematic drawings, in which.

DETAILED DESCRIPTION

Figure 1:
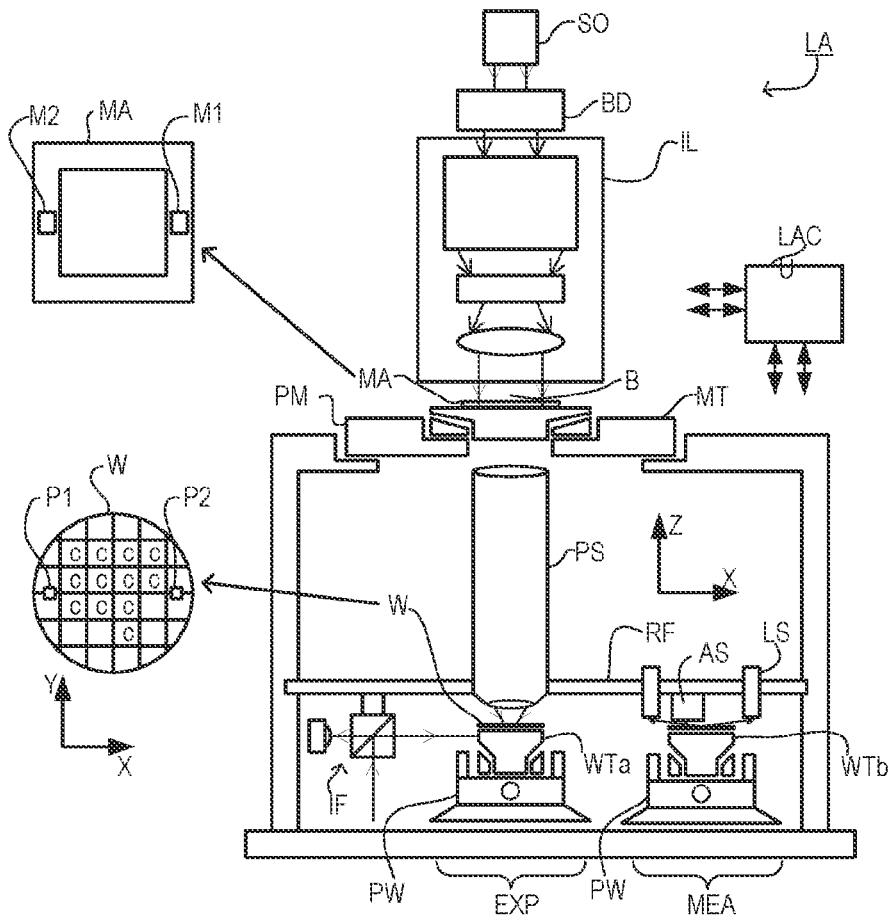
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support (e.g., a mask table) T constructed to support a patterning device (e.g., a mask) MA and connected to a first positioner PM configured to accurately position the patterning device MA in accordance with certain parameters, one or more substrate supports (e.g., a wafer table) WTa and WTb constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253B2, which is incorporated herein by reference.

Lithographic apparatus LA in this example is of a so-called dual stage type which has two substrate tables WTa and WTb and two stations—an exposure station and a measurement station—between which the substrate tables can be moved. While one substrate on one substrate table is being exposed at the exposure station EXP, another substrate can be loaded onto the other substrate table at, e.g., the measurement station MEA or at another location (not shown) or can be processed at measurement station MEA. A substrate table with a substrate can be located at measurement station MEA so that various preparatory steps may be carried out. The preparatory steps may include mapping the surface height of the substrate using a level sensor LS and/or measuring the position of alignment marks on the substrate using an alignment sensor AS. Due to inaccuracies in creating the marks and also due to deformations of the substrate that occur throughout its processing, the set of marks may next to translation and rotation have undergone more complex transformations. Consequently, in addition to measuring position and orientation of the substrate, the alignment sensor in practice may measure in detail the positions of many marks across the substrate area, if the apparatus LA is to print product features at the correct locations with high accuracy. The measurement of alignment marks can therefore be time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. The embodiments of the present disclosure can be applied in an apparatus with only one substrate table, or with two or more.

In addition to having one or more substrate supports, the lithographic apparatus LA may comprise a measurement stage (not shown). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The apparatus further includes a lithographic apparatus control unit LACU which controls all the movements and measurements of various actuators and sensors of the lithographic apparatus (such as those described). Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
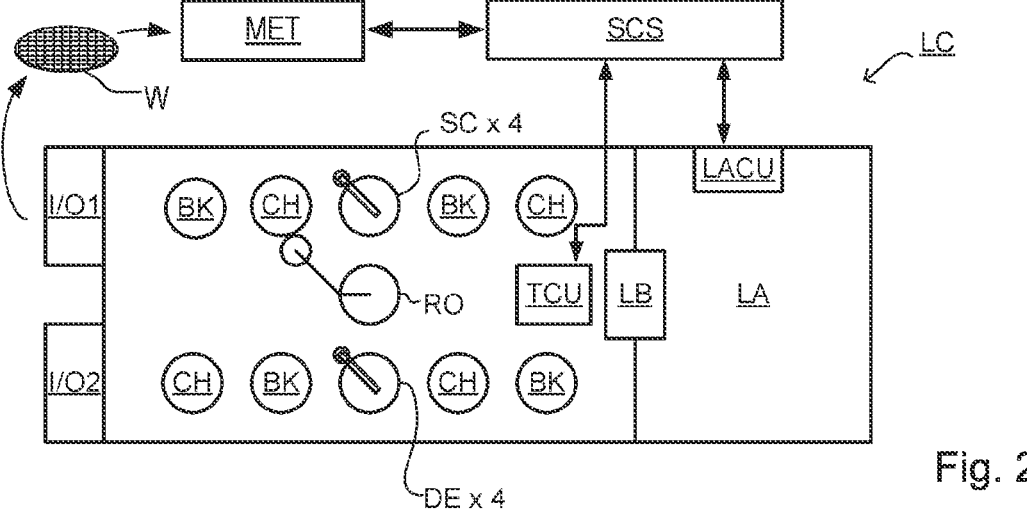
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatuses to perform pre- and post-exposure processes on a substrate W. Conventionally these apparatuses includes one or more spin coaters SC to deposit resist layers, one or more developers DE to develop exposed resist, one or more chill plates CH and one or more bake plates BK, e.g. for conditioning the temperature of substrates W e.g. for conditioning solvents in the resist layers. A substrate handler, or robot, RO picks up substrates W from input/output ports I/O1, I/O2, moves them between the different processing apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus MET, which may also be referred to as a metrology apparatus or metrology tool, is used to determine one or more properties of the substrates W, and in particular, how one or more properties of different substrates W vary or how one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (an image in a resist layer after the exposure), or on a semi-latent image (an image in a resist layer after a post-exposure bake step), or on a developed resist image (in which the exposed or unexposed parts of the resist have been removed), or even on an etched image (after a pattern transfer step such as etching).

Figure 3:
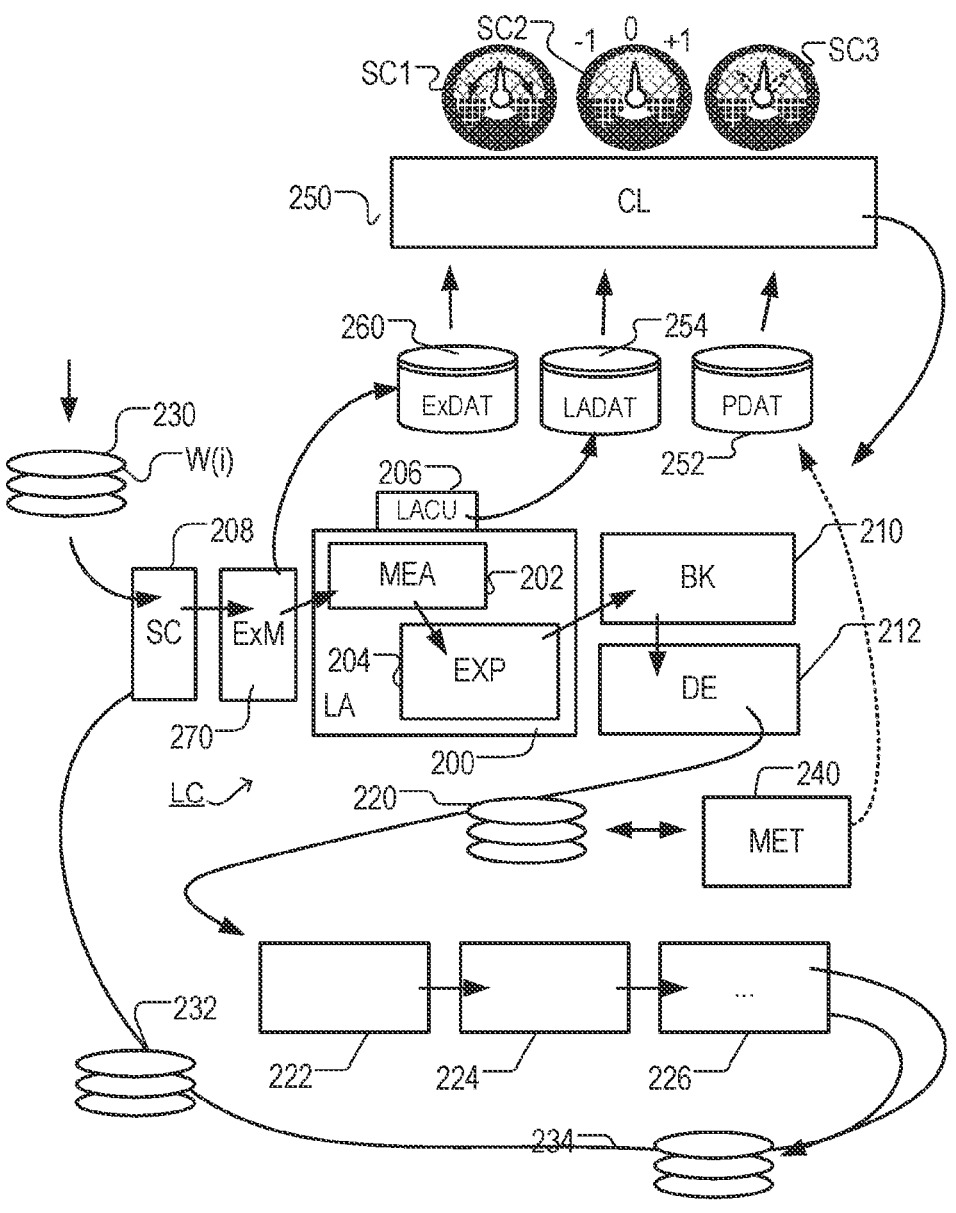
FIG. 3 shows schematically the use of the lithographic apparatus and lithographic cell of FIGS. 1 and 2 together with one or more other apparatuses forming a manufacturing facility for, e.g., semiconductor devices, the facility implementing a control strategy, according to some embodiments of the present disclosure.

FIG. 3 shows the lithographic apparatus LA and the lithocell LC in the context of an industrial manufacturing facility for, e.g., semiconductor products. Within the lithographic apparatus (or "litho tool" 200 for short), the measurement station MEA is shown at 202 and the exposure station EXP is shown at 204. The control unit LACU is shown at 206. As already described, litho tool 200 forms part of a "litho cell" or "litho cluster" that also includes a coating apparatus SC, 208 for applying photosensitive resist and/or one or more other coatings to substrate W for patterning by the apparatus 200. At the output side of apparatus 200, a baking apparatus BK, 210 and developing apparatus DE, 212 are provided for developing the exposed pattern into a physical resist pattern. Other components shown in FIG. 3 are omitted, for clarity.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this example is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

The described semiconductor manufacturing process comprising a sequence of patterning process steps is just one example of an industrial process in which the techniques disclosed herein may be applied. The semiconductor manufacturing process includes a series of patterning steps. Each patterning process step includes a patterning operation, for example a lithographic patterning operation, and a number of other chemical and/or physical operations.

The manufacture of semiconductor devices involves many repetitions of such processing, to build up device structures with appropriate materials and patterns, layer-by-layer on the substrate. Modern device manufacturing processes may comprise 40 or 50 individual patterning steps, for example. Accordingly, substrates 230 arriving at the litho cluster may be newly prepared substrates, or they may be substrates that have been processed previously in this cluster 232 or in another apparatus entirely. Similarly, depending on the required processing, substrates on leaving apparatus 226 may be returned for a subsequent patterning operation in the same litho cluster (such as substrates 232), they may be destined for patterning operations in a different cluster (such as substrates 234), or they may be finished products to be sent for dicing and packaging (such as substrates 234).

Each layer of the product structure typically involves a different set of process steps, and the apparatuses used at each layer may be completely different in type. Further, even where the processing steps to be applied by the apparatuses are nominally the same, in a large facility, there may be several supposedly identical machines working in parallel to perform the processing on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. Parallel processing may also be performed in different chambers within a larger apparatus. Moreover, in practice, different layers often involve different etch processes, for example chemical etch, plasma etch, etc., according to the details of the material to be etched, and special requirements such as, for example, anisotropic etching.

The previous and/or subsequent processes may be performed in other lithography apparatuses, as just mentioned, and may even be performed in different types of lithography apparatus. For example, one or more layers in the device manufacturing process which are very demanding in terms of, e.g., resolution and/or overlay may be performed in a more advanced lithography tool than one or more other layers that are less demanding. Therefore, one or more layers may be exposed in an immersion type lithography tool, while one or more others are exposed in a dry tool. One or more layers may be exposed in a tool working at DUV wavelengths, while one or more others are exposed using EUV wavelength radiation.

Also shown in FIG. 3 is the metrology apparatus (MET) 240 which is provided for making measurements of parameters of the products at desired stages in the manufacturing process. A common example of a metrology station in a modern lithographic manufacturing facility is a scatterometer, for example an angle-resolved scatterometer or a spectroscopic scatterometer, and it may be applied to measure one or more properties of developed substrates at 220 prior to etching in the apparatus 222. Using metrology apparatus 240, performance parameter data PDAT 252 may be determined. From this performance parameter data PDAT 252, it may be further determined that a performance parameter, such as overlay or critical dimension (CD), does not meet specified accuracy requirements in the developed resist. Prior to the etching step, the opportunity exists to strip the developed resist and reprocess one or more of the substrates 220 through the litho cluster. Moreover, the metrology results from the metrology apparatus 240 can be used to maintain accurate performance of the patterning operations in the litho cluster, by making small adjustments over time, thereby reducing or minimizing the risk of products being made out-of-specification, and requiring re-work. Of course, metrology apparatus 240 and/or one or more other metrology apparatuses (not shown) can be applied to measure one or more properties of the processed substrates 232, 234, and/or of incoming substrates 230.

Typically the patterning process in a lithographic apparatus LA is one of the most significant steps in the processing which involves high accuracy of dimensioning and placement of structures on the substrate W. To help ensure this high accuracy, three systems may be combined in a control environment as schematically depicted in FIG. 3. One of these systems is the litho tool 200 which is (virtually) connected to a metrology apparatus 240 (a second system) and to a computer system CL 250 (a third system). A desire of such an environment is to optimize or improve the cooperation between these three systems to enhance an overall so-called "process window" and provide one or more tight control loops to help ensure that the patterning performed by the lithographic apparatus LA stays within a process window. The process window defines a range of values of a plurality of process parameters (e.g. two or more selected from dose, focus, overlay, etc.) within which a specific manufacturing process yields a defined result (e.g. a functional semiconductor device)—typically a range within which the values of the process parameters in the lithographic process or patterning process are allowed to vary while yielding a proper structure (e.g., specified in terms of an acceptable range of CD (such as +−10% of a nominal CD)).

The computer system CL may use (part of) the design layout to be patterned to predict which one or more resolution enhancement techniques to use and to perform computational lithography simulations and calculations to determine which patterning device layout and lithographic apparatus settings achieve a largest overall process window of the patterning process (depicted in FIG. 3 by the double arrow in the first dial SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second dial SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third dial SC3).

Computer system 250 can implement control of the process based on a combination of (i) "pre-processing metrology data" (e.g., including scanner metrology data LADAT 254, and External pre-processing metrology ExDAT 260), associated with substrates before they are processed in a given processing step (for example a lithography step) and (ii) performance data or "post-processing data" PDAT 252 that is associated with the substrates after they have been processed.

A first set of pre-processing metrology data LADAT 254 (referred to herein as scanner metrology data, as it is data generated by the lithographic apparatus LA 200 or scanner) may comprise the alignment data conventionally obtained by the lithographic apparatus LA 200 using alignment sensor AS in the measurement station 202. Alternatively, or in addition to the alignment data, the scanner metrology data LADAT 254 may include height data obtained using level sensor LS, and/or "wafer quality" signals from the alignment sensor AS or the like. As such, the scanner metrology data LADAT 254 may comprise an alignment grid for the substrate, and data relating to substrate deformation (flatness). For example, the scanner metrology data LADAT 254 may be generated by the measurement station MEA 202 of twin stage lithographic apparatus LA 200 (e.g., as this typically comprises the alignment sensor and leveling sensor) in advance of exposure, enabling simultaneous measurement and exposure operations. Such twin stage lithographic apparatus are well known.

Increasingly, (e.g. stand-alone) external pre-exposure metrology tools ExM 270 are used to make measurements before exposure on a lithographic apparatus. Such external pre-exposure metrology tools ExM 270 are distinct from the measurement station MEA 202 of a twin stage lithographic apparatus LA 200. Any pre-exposure measurements performed within the track are also considered to be external measurements. To maintain exposure throughput at a sufficient level, the scanner metrology data LADAT (e.g., alignment grid and substrate deformation grid) measured by measurement station MEA 202 is based on a sparser set of measurements as would be desirable. This typically means such a measurement station is incapable of gathering sufficient measurement data for higher order corrections, and particularly corrections beyond the third order. In addition to this, use of an opaque hard mask can make it difficult to accurately measure the wafer grid in alignment.

External pre-exposure metrology tools ExM 270 enable much denser measurements to be made on each substrate, prior to exposure. Some of these pre-exposure metrology tools ExM 270 measure and/or predict wafer grid deformation at a throughput equal to or faster than the scanner, and with a measurement density much higher than can be achieved using an alignment sensor and level sensor, even when such sensors are comprised within a separate measurement station MEA 202. Pre-exposure metrology tools comprise, for example, substrate shape inspection tools and/or stand-alone alignment stations.

While FIG. 3 shows separate storage 252, 254, 260 for each of the performance data PDAT, scanner metrology data LADAT and external pre-exposure data ExDAT, it will be appreciated that these different types of data may be stored in one common storage unit, or may be distributed over a larger number of storage units, from which particular items of data can be retrieved when required.

To represent alignment measurements over a wafer and/or over a field, an alignment model is used. A first purpose of an alignment model is to provide a mechanism for interpolating and/or extrapolating the available measurements data over the whole wafer, such that an expose grid can be created on each exposure field. The measurement data will be sparse as it is simply not practical to measure as many measurement regions as would be desirable from an overlay accuracy perspective: the time and therefore throughput overhead would be too high. A second purpose of an alignment model is to provide noise suppression. This may be achieved by using fewer model parameters than measurements or by using regularization.

While standard models might use fewer than ten parameters, advanced alignment models typically use more than 15 parameters, or more than 30 parameters. Examples of advanced models are higher order wafer alignment (HOWA) models and radial basis function (RBF) based alignment models. HOWA is a published technique based on second and higher order polynomial functions. RBF modeling is described in US2012218533A1, which is incorporated herein by reference. Different versions and extensions of these advanced models can be devised. The advanced models generate a complex description of the wafer grid that is corrected for, during the exposure of the target layer. RBF and latest versions of HOWA provide particularly complex descriptions based on tens of parameters. This implies many measurements are required to obtain a wafer grid with sufficient accuracy.

RBF modeling is an extrapolation/interpolation modeling technique able to capture localized wafer deformations better than polynomial models. The type of RBF model described in detail in US2012218533A1 is known as a thin plate spline model. This model is a functional minimizing spline, where the functional being minimized comprises an integral of a density function that depends on the second derivatives of the model.

Present wafer alignment strategies provide a feedforward wafer grid correction based on alignment sensor measurements performed, for every wafer, on alignment marks printed in a previous exposure. The main goal of wafer alignment is to minimize overlay of a layer to be printed with respect to a previous layer. This may be achieved using a least squares fit of an alignment model to the alignment sensor measurements. The alignment model aims to describe the position and deformation of a layer over the entire wafer as accurately as possible. Subsequently the alignment model is used for positioning of the wafer during an exposure to print the next layer, such that it is aligned with the previous layer as well as possible.

A number of post-processing steps in wafer alignment already exist, which include e.g. parameter clipping, parameter scaling and model mapping. Wafer alignment model mapping (WAMM) is a training method based on on-product overlay and alignment data that is shown to improve on-product overlay variation. WAMM is described in US10331040B2, which is hereby incorporated by reference. In WAMM, a column vector with fitted parameters is linearly mapped to a different column vector or model parameters $p_{fit}$ with a so called model mapping matrix $M_{MM}$:

$$p_{MM}=M_{MM}p_{fit} \qquad [1]$$

where $M_{MM}$ is determined in a machine learning application. The mapped parameters $p_{MM}$ are subsequently used for determining the exposure corrections. Present wafer alignment modelling techniques (e.g., including WAMM) aim only to minimize overlay with a previous layer on the same wafer. This may not always be optimal for overlay with layers to be added later. In some use cases, fabrication tools for processing layers to be added later and/or to perform a bonding process to bond two or more wafers together, might be more limited in their correction capability than the tool used for the present layer. A specific example of such a use case is the aforementioned wafer bonding, in which two patterned wafers are bonded together to make a single new substrate.

Figure 4:
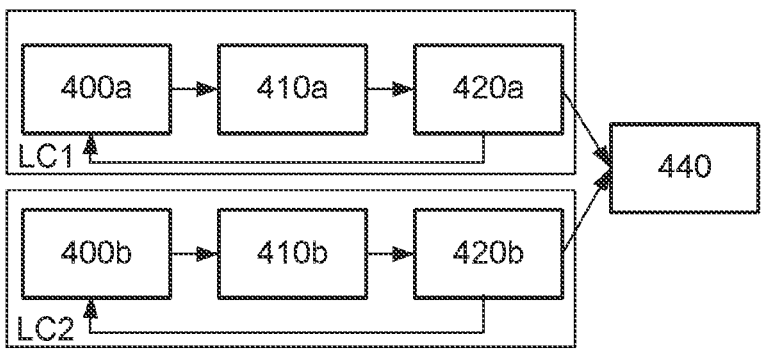
FIG. 4 is a flow diagram describing a present method of manufacturing integrated devices which utilizes wafer-to-wafer bonding.

FIG. 4 shows a device manufacturing arrangement for making bonded substrates (and therefore ICs based on bonded substrates) comprising a first manufacturing lithocell LC1 and a second manufacturing lithocell LC2. Within each lithocell is a pair of lithographic processing systems 400a, 400b and (optional) metrology systems 410a, 410b (which may be external or internal to the lithographic processing systems 400a, 400b). The lithographic processing system 400a, 400b, may optionally comprise a full patterning system. Such a system may comprise, for example, an optical lithographic apparatus or scanner such as described in respect of FIG. 1 and optionally one or more of: a track tool, a deposition tool, an etch tool, any other apparatus used in the patterning process. The systems may also each comprise a software application 420a, 420b in communication with its respective lithographic processing system 400a, 400b and metrology system 410a, 410b, so that results, designs, data, etc. of the lithographic processing system 400a, 400b and/or the metrology apparatus 410a, 410b may be stored and analyzed by the software application 420a, 420b at the same time or different times.

Once pairs of substrates or wafers are completed from each of lithocell LC1 and lithocell LC2, they may be bonded within a bonding tool 440 to obtain a bonded wafer. Bonding in this context is wafer-to-wafer bonding where whole wafers are aligned and bonded together such that individual dies on each wafer are aligned. The concept of wafer-to-wafer bonding is known and used in many IC manufacturing processes. The bonding tool 440 may comprise a bonding alignment device for aligning the wafers together for bonding. For example, the bonding tool 440 may perform pre-align using box-in-box marks provided to wafers (e.g., one box on each wafer), with visual inspection of marks used for alignment quality/position control. Another method uses two imaging sensors (e.g., face to face) which are first calibrated together to find their relative positions; each sensor is then used to separately align a respective wafer to be bonded.

Lithocell LC1 and lithocell LC2 may be the same lithocell, different lithocells but comprising one or more shared tools and elements, or be completely different lithocells having completely different sets of apparatuses and tools, possibly even at different sites or fabs. For example, one or more of the tools or apparatuses of the lithographic processing systems 400a and 400b may comprise different tools or the same tools within each respective system. Similarly metrology apparatuses 410a and 410b may be the same apparatus or different apparatuses. The software application 420a, 420b may be comprised within one or both of the respective lithographic processing systems 400a, 400b and/or one or both of the metrology systems 410a, 410b, or elsewhere.

As mentioned above, the lithographic processing system 400a, 400b may be configured to include the lithographic apparatus LA in FIG. 1. The lithographic processing system 400a, 400b may comprise one or more internal metrology systems 410a, 410b and/or external metrology systems 410a, 410b. For example, the lithographic processing system 400a, 400b may each comprise a metrology apparatus 410a, 410b in the form of an alignment sensor for performing alignment metrology which is used by the lithographic processing system 400a, 400b to make feedforward corrections for an exposure, e.g., to correct for wafer deformations as measured by the alignment sensor. Feedback corrections may also be determined based on measurements (e.g., of overlay) on exposed wafers performed using (e.g., external) metrology apparatus 410a, 410b.

The lithographic processing system 400a, 400b may be setup for executing the patterning aspect of the patterning process and optionally, may be configured to correct for deviations occurring within the lithographic processing system 400a, 400b or in one or more other processes or apparatuses in the patterning process. The lithographic processing system 400a, 400b may be able to apply a correction of an error (e.g., imaging error, focus error, dose error, etc.) by adjusting one or more modification apparatuses of the lithographic processing system 400a, 400b. That is, correction may be made by any manufacturing processing tool in the lithographic processing system 400a, 400b that can purposefully modify a patterning error. In present systems, however, these corrections (scanner corrections and other processing tool corrections) do not take into account any of the bonding processes performed by the bonding tool 440.

For example, the correction of an error can be made by adjusting one or more modification apparatuses of the lithographic apparatus, e.g., by employing the adjustment mechanism AM to correct for or apply an optical aberration, by employing the adjuster AD to correct or modify an illumination intensity distribution, by employing the positioner PM of the patterning device support structure MT and/or the positioner PW of the wafer table WT to correct or modify the position of the patterning device support structure MT and/or the wafer table WT respectively, etc. Where, for example, the lithographic processing system 400a, 400b comprises a track tool, correction of an error can be made by adjusting one or more modification apparatuses of the track tool, e.g., modifying a bake temperature of a bake tool of the track, modifying a development parameter of a development tool of the track, etc. Similarly, where, for example, the lithographic processing system 400a, 400b comprises an etch tool, correction of an error can be made by adjusting one or more modification apparatuses of the etch tool, e.g., modifying an etch parameter, such as etchant type, etchant rate, etc. Similarly, where, for example, the lithographic processing system 400a, 400b comprises a planarization tool, correction of an error can be made by adjusting one or more modification apparatuses of the planarization tool, e.g., modifying a planarization parameter. Similarly, where, for example, the lithographic processing system 400a, 400b comprises a deposition tool, correction of an error can be made by adjusting one or more modification apparatuses of the deposition tool, e.g., modifying a deposition parameter.

One or more modification apparatuses of the lithographic processing system 400a, 400b may be able to apply up to third order polynomial correction of errors (e.g., imaging error, focus error, dose error, etc.).

The metrology apparatus 410a, 410b may be configured to obtain measurements related to wafers printed with patterns by the lithographic processing system 400a, 400b. The metrology apparatus 410a, 410b may be configured to measure or determine one or more parameters (e.g., overlay error, dose, focus, CD, etc.) of the patterns printed by the lithographic processing system 400a, 400b. The metrology apparatus 410a, 410b may be external to the lithographic processing system 400a, 400b and may be, for example, a diffraction-based overlay metrology tool or scanning electron microscope that can measure, e.g., overlay, critical dimension and/or other parameters. The metrology apparatus 410a, 410b may be an alignment apparatus (e.g., comprised within the lithographic processing system 400a, 400b and/or as an external stand-alone unit) used to measure relative position between two objects, such as between a patterning device and a wafer. The metrology apparatus 410a, 410b may be a level sensor (e.g., comprised within the lithographic processing system 400a, 400b and/or as an external stand-alone unit) to measure a position of a surface, e.g., a height and/or rotational position of a wafer surface. The metrology apparatus 410a, 410b may be a plurality of metrology apparatuses including any combination of these devices. As such, the order of the blocks in the diagram should not be taken to imply a specific order: e.g., alignment/leveling metrology will be performed prior to exposure and other metrology (e.g., overlay/focus/CD metrology) may be performed subsequent to exposure).

The metrology apparatus 410a, 410b may measure and/or determine one or more values of one or more parameters (e.g., overlay error, CD, focus, dose, etc.) associated with an error in the patterning process. After the metrology apparatus 410a, 410b finishes the measurement or determination, the software application 420a, 420b creates modification information based on the measurement data (e.g., overlay error, CD, focus, dose, etc.). The software application 420a, 420b may evaluate the one or more values of the one or more parameters to determine if they are within a tolerance range. If not, the software application 420a, 420b determines modification information to correct an error reflected by the out of tolerance one or more values of the one or more parameters. The software application 420a, 420b may use one or more mathematical models to determine error correctable by one or more modification apparatuses of the lithographic processing system 400a, 400b and to provide information for one or more parameters (e.g. modification information) of the one or more modification apparatuses of the lithographic processing system 400a, 400b, which one or more parameters enable configuration of the one or more modification apparatuses of the lithographic processing system 400a, 400b to correct (e.g., eliminate or reduce to within a tolerance range) the error. One or more of the mathematical models may define a set of basis functions that fit the data once parameterized. The one or more mathematical models may comprise a model configured to simulate correctable error for the lithographic processing system 400a, 400b. The model may specify a range of modifications that one or more of the modification apparatuses of the lithographic processing system 400a, 400b can make and determines correctable error within the range. That is, the range may specify an upper limit, a lower limit, and/or both on the amount of modifications that a particular modification apparatus of the lithographic processing system 400a, 400b can make.

There are a number of drawbacks with the method described in relation to FIG. 4. Present scanner control methods are unaware of, and therefore do not take into account of, potential actuation limitations of one or more tools used in subsequent steps, e.g., in bonding steps with other wafers. In comparison with the scanner 400a, 400b, the bonding tool 440 is more limited in deforming wafers so as to make them more similar to each other (e.g., similar fingerprints). The limited correction capability of the bonding tool 440 is partly due to its limited correction actuation capability. For example, a typical bonding tool 440 may only provide four correction actuations which allow for four-parameter alignment corrections: wafer translations along e.g., x- and y-direction of a horizontal plane substantially parallel to the top surface of a wafer, wafer rotation about a central vertical axis (e.g., z-axis) normal to the horizontal plane, and symmetrical wafer magnification (i.e. symmetrically expanding a wafer in x- and y-direction). The capability of providing the four-parameter alignment corrections limits the bonding tool 440 to correctly loading a wafer (e.g., via x- and y-direction translations and rotation of the wafer) and inducing a symmetrical magnification to the wafer. Such correction capability is insufficient to correct certain wafer grid distortions (e.g., asymmetrical magnification) present in the wafer interfaces to be bonded, resulting in an overlay penalty between the two bonded wafers.

Such uncorrectable wafer grid distortions may result from the mismatch in correction capability between the scanner 400a, 400b and the bonding tool 440. For example, the scanner 400a, 400b provides more correction actuations and thus allows use of a high-order alignment model with more model parameters (e.g., six or more model parameters). A high order alignment model can better describe the wafer deformation and therefore provide more accurate alignment correction which effectively minimizes internal overlay (overlay between any internal layers) of each wafer. However, after applying the optimal wafer alignment corrections, the deformations of the wafer interfaces to be bonded may be beyond the correction capability of the bonding tool 440. Consequently, wafers may be bonded together which have incompatible or poorly optimized grids. A possible solution is to align the final layer of each wafer using an alignment model that matches to the correction capability of the bonding tool 440. For example, the final layer of each wafer could be aligned with respect to a previous layer using an alignment model with four model parameters matching to the four-parameter alignment corrections provided by the bonding tool 440. In such a way, bonding overlay between the two wafer interfaces to be bonded could be reduced or minimized. However, the problem with such an approach is that bonding overlay is minimized by scarifying (or increasing) solely the internal overlay between the final layer (to be bonded with another wafer) and a previous layer of each wafer. This approach often results in out-of-spec internal overlay as internal overlay specifications are typically tighter than bonding overlay specifications.

To address one or more of the issues raised above, a method is disclosed for determining a process correction for at least a first process (e.g., an exposure) of a lithographic process which comprises at least the first process performed on at least a first substrate using at least a first apparatus (e.g., a scanner) and a second process (e.g., wafer bonding) performed on at least said first substrate using at least a second apparatus (e.g., bonding tool), where a correction actuation capability of the first apparatus differs from the second apparatus. The method comprises: obtaining metrology data (e.g., alignment data) relating to said first substrate; modeling said metrology data using a first model, said first model being related to said first apparatus; and controlling said first process based on the modeled metrology data. The modeling step and/or an additional processing step comprises distributing a penalty in a performance parameter across said first process and said second process such that the distributed penalties in the performance parameter for said first process and said second process are within their respective specifications of the performance parameter.

The description below will describe an example where the second process is a wafer bonding process and the second apparatus a wafer bonding apparatus. However this is a specific implementation of the concepts herein for which the concepts are useful. However, other implementations may be envisaged, and the concepts herein are equally applicable to such implementations. For example, the first and second apparatuses may both be lithography exposure apparatuses and the first and second processes may both be lithography exposure processes; e.g., where the first and second apparatuses have different actuation capabilities (e.g., different models/product lines, such as, purely for example, a DUV scanner and an EUV scanner).

In a specific example, the method may optimize wafer alignment so as to distribute a bonding overlay penalty for a bonded substrate optimally between different layers. The proposed method may allocate different portions of the bonding overlay penalty to different layers for example based on overlay specifications of each layer.

The proposed method may be particularly suitable for cases where overlay specifications of any internal layer of each pre-bonded wafer are different in different directions. For example, when overlay in one direction (e.g., x direction) is more critical than another (e.g., y direction), the proposed method may be able to distribute the bonding overlay penalty between different layers in such a way that the overall bonded overlay of the bonded wafer is maintained within specification in both directions.

In a specific example, it may be that the limitations of the correction potential of the second apparatus or bonding tool does not include asymmetric corrections such as asymmetric magnification, which is available on the scanner (first apparatus). Corrections determined via the methods described herein may sacrifice some overlay in, e.g., the final layer exposure such that the final layer exposure performance after correction is not necessarily as good as it would be if normal alignment to the previous layer only had been performed but still within specification, in favor of improving the correction for the overall bonded wafer. In particular, such a correction for the final layer exposure might use the asymmetric correction capability within the scanner to sacrifice some overlay in the less critical dimension in favor of ensuring that the overlay in the critical dimension of the bonded wafer is maintained within specification.

The proposed method is implemented based on the following two assumptions: 1) any correction that is not within the actuation potential (e.g., the four actuations of the bonding tool as described above) of the future or next layer is considered to be an overlay penalty between the current layer and the future layer (e.g., "bonding overlay" or overlay between the interface between two wafers being bonded in wafer bonding use cases); 2) any deviation from the correction as determined using the wafer alignment model is considered to be an overlay penalty with a previous layer (e.g., "internal overlay" of a wafer for wafer bonding use cases).

In some embodiments, optimal alignment corrections can be obtained by minimizing a weighted sum of previous and future overlay in at least one direction of the substrate plane. In some embodiments, the minimization may minimize a weighted sum of previous and future overlay in at both directions (x and y).

By way of a specific example, such a weighted sum can be expressed as:

$$OVL_{ws} = w_{x,previous} \times OVL_{x,previous}(P) + w_{y,previous} \times OVL_{y,previous}(P) + w_{x,future} \times OVL_{x,future}(P) + w_{y,future} \times OVL_{y,future}(P). \qquad [2]$$

wherein $w_{x,previous}$ and $w_{y,previous}$ denote weights for the previous layer in x and y directions respectively; $w_{x,future}$, and $w_{y,future}$ denote weights for the future layers in x and y directions respectively. These four (or two in a single direction case) weights can be, for example, chosen in such a way that they are related, e.g., inversely proportional, to the overlay specifications of the respective layers in the respective directions. The proposed method can be implemented in different ways.

Figure 5:
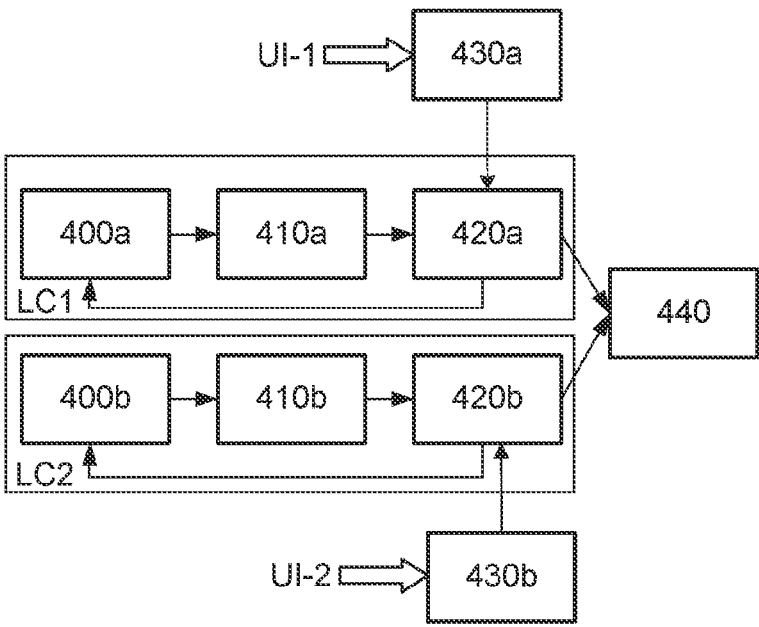
FIG. 5 is a flow diagram describing a proposed method of manufacturing integrated devices which utilizes wafer-to-wafer bonding, according to some embodiments of the present disclosure.

FIG. 5 shows a modified device manufacturing arrangement for making bonded substrates. As shown in FIG. 5, the device manufacturing arrangement shown in FIG. 4 may be modified by including an additional software application 430a, 430b for each of lithocell LC1 and lithocell LC2. The additional software application 430a, 430b may be communicatively coupled to the software application 420a, 420b and may additionally allow for user input UI-1, UI-2. In some implementations, the additional software application 430a, 430b may be used as a "setup" application which calculates some input needed in the software application 420a, 420b. For example, the additional software application 430a, 430b may receive data from the user input UI-1, UI-2 and optionally from the software application 420a, 420b, perform calculations using the received data, and output calculated data to the software application 420a, 420b. The data received from the user input UI-1, UI-2 may comprise information about the bonding tool 440 (e.g., actuation capability of the bonding tool 440). The additional software application 430a, 430b may either be incorporated into the software application 420a, 420b, or be used as a standalone application controllable by the software application 420a, 420b. The additional software application 430a, 430b may be hosted within one or both scanners 400a, 400b, within another tool of the lithocell or a separate processing device.

The additional software application 430a, 430b may be used in conjunction with the existing software application 420a, 420b to enable an alignment optimization which determines alignment corrections for each pre-bonded wafer. Such optimal alignment corrections may optimally distribute the overlay penalty that is otherwise present only between the two bonding layers to more layers in such an optimal way that overlay specifications of all wafer layers can be simultaneously met. For example, the additional software application 430a, 430b (or the "setup" application as mentioned above) may be used to first set a model recipe (e.g., a model mapping matrix as described in detail below) once per wafer. Then, the software application 420a, 420b (e.g., the alignment software used by the alignment sensor) may determine the optimal wafer grid for each wafer again based on the model recipe determined by the setup tool 430a, 430b.

In an implementation, the weighted overlay sum shown in equation [2] may be rewritten as a cost function C consisting of a weighted sum of x- and y-direction squared overlay penalties with a previous and future layer:

$$C = w_{x,previous} \sigma_{x,previous}^2 + w_{y,previous} \sigma_{y,previous}^2 + w_{x,future} \sigma_{x,future}^2 + w_{y,future} \sigma_{y,future}^2, \qquad [3]$$

in which $\sigma_{x,previous}^2$ and $\sigma_{y,previous}^2$ denote respectively x- and y-direction squared overlay penalties with the previous layer; $\sigma_{y,previous}^2$ and $\sigma_{y,future}^2$ denote respectively x- and y-direction squared overlay penalties with the future layer. A single direction cost function is of course possible.

The aim of any wafer alignment model is to describe the wafer deformation well. Therefore, assuming that the wafer alignment model is doing a good job, it can be thought that any deviation from the wafer alignment model parameters $p_{fit}$ by using a different set of parameters to the same model $p_{MM}$ introduces an overlay penalty with the previous layer. Using this assumption, the x-/y-direction squared overlay penalty with the previous layer can be calculated by:

$$\sigma_{x/y,previous}^2 = \int\int_{wafer} (f_{x/y}(p_{fit} - p_{MM}))^2 dx_{nom} dy_{nom}, \qquad [4]$$

in which $$f(p) = \begin{bmatrix} f_x(p) \\ f_y(p) \end{bmatrix}$$

is the wafer alignment model and parameters $p_{MM}$ are related to parameters $p_{fit}$ by a mapping $M_{MM}$, as has been described.

For linear models (i.e., models that can be written as $$f(p) = \sum_i p_i f_i(x_{nom}, y_{nom}))$$

the squared overlay penalty can be written as:

$$\sigma_{x/y,previous}^2 = (p_{fit} - p_{MM})^T R_{p,x/y}(p_{fit} - p_{MM}), \qquad [5]$$

where $R_{p,x/y}$ are matrices, more specifically overlay penalty matrices. For completeness, a solution for polynomial basis functions $f_i(x_{nom}, y_{nom})$ will be provided below.

For the squared overlay penalty with the future layer, the assumption is made that a future layer's correction potential is limited to a subspace of the alignment model. For example, the four-parameter alignment corrections provided by a bonding tool can be described by a four-parameter actuation model which is a subspace of any polynomial model of order larger than 0. The x-/y-direction squared overlay penalty with the future layer can therefore be written as:

$$\sigma^2_{x/y,future} = \int\int_{wafer} (f_{x/y}((I - M_{conv})p_{MM}))^2 dx_{nom}dy_{nom}, \quad [6]$$

in which I is the identity matrix and $M_{conv}$ is a matrix that converts the alignment model parameters to the subspace model parameters that are the best least squares fit to the full space model parameters over the entire wafer. More detail of this conversion matrix, in accordance with some embodiments, is described below.

For linear models $\sigma_{x/y,future}{}^2$ can be written as:

$$\sigma_{x/y,future}{}^2 = p_{MM}{}^T(I - M_{conv})^T R_{p,x/y}(I - M_{conv})p_{MM}. \quad [7]$$

Equations [5] & [7] can now be inserted in equation [1], resulting in:

$$C = (p_{MM} - p_{fit})^T R_{previous}(p_{MM} - p_{fit}) + p_{MM}{}^T(I - M_{4\ par,conv})$$
$$^T R_{future}(I - M_{4\ par,conv})p_{MM}, \quad [8]$$

in which $R_{previous} = w_{x,previous}R_{p,x} + w_{y,previous}R_{p,y}$ and $R_{future} = w_{x,future}R_{p,x} + w_{y,future}R_{p,y}$, The model parameters $p_{MM}$ that the fitted model parameters $p_{fit}$ should be converted to in order to minimize the cost function may be found by setting the gradient of C towards $p_{MM}$ to zero and solving the resulting equation for $p_{MM}$. This results in the solution given by:

$$p_{MM} = (R_{previous} + (I - MM_{4\ par,conv})^T R_{future}(I - M_{4\ par,conv}))^{-1} R_{previous}o_{fit} = M_{MM}p_{fit}, \quad [9]$$

which shows that in this implementation, the optimization step to distribute the overlay penalty is a linear mapping of the fit parameters. $M_{MM}$ s the model mapping matrix to perform this linear mapping.

For those scanners already equipped with suitable scanner interface and architecture for performing WAMM, the existing software application 420a, 420b may be used to perform the model mapping as described in equation [9].

Prior to performing the model mapping, the model mapping matrix $M_{MM}$ may be calculated (e.g., by the additional software application 430a, 430b or otherwise). The calculation of the model mapping matrix $M_{MM}$ may comprise for example the following three main steps: (1) defining a cost function (e.g., as described in equation [3]) comprising a weighted sum of the squared penalty in the performance parameter (e.g., overlay) in a first direction (e.g., x direction) for a first process (e.g., lithographic exposure of the final layer of each pre-bonded wafer), the squared penalty in the performance parameter in a second direction (e.g., y direction) for the first process, the squared penalty in the performance parameter in the first direction for the second process (e.g., bonding the final layers of the two wafers), and the squared penalty in the performance parameter in the second direction for the second process; (2) determining the weights of the cost function based on required specifications for the performance parameter (e.g., overlay specifications) for the first process and second process and the next or future layer actuation model, wherein the specifications and the next or future layer actuation model may both be received as input parameters; (3) obtaining the model mapping matrix by minimizing the cost function.

Once calculated, the model mapping matrix $M_{MM}$ may be outputted to allow the model mapping to be performed. For example, where the additional software application 430a, 430b calculates the mapping matrix, it may then be forwarded to the existing software application 420a, 420b. The model parameters $p_{MM}$ obtained after the model mapping may then be used to determine optimal wafer alignment corrections.

In another implementation, optimal wafer alignment corrections can be obtained by changing the wafer alignment fit into a weighted fit with different weights for the x- and y-direction alignment measurements with a regularization penalty imposed on the model parameters that is equal to the estimated next or future layer overlay. This implementation is in contrast with the foregoing implementation where the existing wafer alignment fit is used but the alignment model is optimally parametrized for best overlay performance. For this implementation, the cost function C that is minimized in the alignment fit is given by:

$$C = w_{x,previous}\sum_i (x_i - f_x(x_{nom,x,i},\ y_{nom,x,i}))^2 + \quad [10]$$
$$w_{y,previous}\sum_i (y_i - f_y(x_{nom,y,i},\ y_{nom,y,i}))^2 \ldots ,$$
$$+ w_{x,future}\sigma^2_{x,future} + w_{y,future}\sigma^2_{y,future}$$

in which $x_i$ is the $i^{th}$ x-direction alignment measurement on nominal position $(x_{nom,x,i},\ y_{nom,x,i})$ and in which $y_i$ is $i^{th}$ y-direction alignment measurement on nominal position $(x_{nom,y,i},\ y_{nom,y,i})$. This cost function C can in matrix-form be written as:

$$C = (x - Mp_{fit})^T \begin{bmatrix} w_{x,previous}I & 0 \\ 0 & w_{y,previous}I \end{bmatrix} (x - Mp_{fit}) \ldots , \quad [11]$$
$$+ p_{fit}^T(I - M_{4par,conv})^T R_{future}(I - M_{4par,conv})p_{fit}$$

in which x is a column vector with the alignment measurement (x- and y-direction concatenated) and M is the alignment model matrix. The difference with a normal wafer alignment fit is the presence and shape of the second part in the cost function, i.e. the regularization penalty on the estimated future overlay:

$$p_{fit}^T(I - M_{4\ par,conv})^T R_{future}(-M_{4\ par,conv})p_{fit}$$

and the presence of the weighting matrix in the first part:

$$\begin{bmatrix} w_{x,previous}I & 0 \\ 0 & w_{y,previous}I \end{bmatrix}.$$

The solution that minimizes this cost function may be found by setting the gradient towards $p_{fit}$ to zero and solving for $p_{fit}$ resulting in:

$$p_{fit} = \left(M^T \begin{bmatrix} w_{x,previous}I & 0 \\ 0 & w_{y,previous}I \end{bmatrix} M + \right.$$
$$\left. (I - M_{4par,conv})^T R_{future}(I - M_{4par,conv})\right)M^T \begin{bmatrix} w_{x,previous}I & 0 \\ 0 & w_{y,previous}I \end{bmatrix} x,$$

In this implementation, the additional software application 430a, 430b may be used to calculate fitting-relevant data, i.e. the weighting matrix and regularization matrix, based on data received from the user input UI-1, UI-2 and optionally from the software application 420a, 420b. The calculated matrices may be sent to the software application 420a, 420b which may then perform the weighted alignment fit for the respective pre-bonded wafer. The fitted parameters $p_{fit}$ obtained from the weighted alignment fit, as defined in equation [11], may then be used to determine optimal wafer alignment corrections. It will be appreciated that wafer overlay can be evaluated in oblique directions and as such the equations above can be written for any arbitrary axis.

While both of the foregoing implementations require some modification (e.g., changing the model parameters or changing the alignment fit) to the existing wafer alignment process for the final layer of each pre-bonded wafer, the proposed method for alignment optimization can also be implemented in combination with an existing or conventional wafer alignment process. Here, an existing or conventional wafer alignment process may be any alignment process which minimizes overlay with a previous layer only in the conventional manner, e.g., as implemented within the scanner.

Instead of using the alignment data obtained for the final layer (e.g., layer N), the proposed method may use the alignment data (e.g., metrology data and model fitted data) obtained for the previous layer (e.g., layer N−1) to determine alignment corrections for the final layer (e.g., layer N) so as to optimally distribute the overlay penalty between different layers (e.g., between the current layer (N) and the previous layer (N−1), and between the current layer and the future layer (N+1)).

In an implementation, both the previous layer (e.g., layer N−1) and final layer (e.g., layer N) of each pre-bonded wafer may be aligned using standard alignment modeling. This time, optimal alignment corrections may be determined (e.g., by the additional software application 430a, 430b operating outside the scanner such as on a separate computing system) and prior to the exposure of the final layer. The additional software application 430a, 430b may use the alignment data obtained for the previous layer (e.g., layer N−1) as substitute data for the final layer (e.g., layer N) to determine alignment corrections. This implementation assumes that the relevant wafer layers (e.g., layer N and layer N−1) have similar or consistent wafer grid distortions (e.g., asymmetrical magnification). The optimal alignment corrections determined outside the scanner may then be added, as an add-on correction, to the alignment correction determined by the existing alignment process. The final correction combining the alignment correction and the add-on correction may then be used as a feed-forward alignment correction in the scanner and be applied for optimal alignment of the final layer (e.g., layer N). Since the add-on correction has already taken account of e.g., the limited correction capability of a bonding tool and/or estimated overlay between the two bonding layers, the final layer (e.g., layer N) can be aligned so as to allow the overlay penalty to be distributed optimally between different layers.

An advantage of this implementation over the foregoing two implementations is that the alignment optimization can be determined or calculated completely outside the scanner prior to exposure of the final layer. However, a potential issue with such an implementation may be that the overlay of the final layer may exceed the overlay specification when the assumption of consistent wafer deformations is not held to be true for the final layer (e.g., layer N).

Note that the alignment optimization as described in any of the above implementations is not limited to be applied only to the final layer of each pre-bonded wafer. In some implementations, the alignment optimization may be applied to multiple layers including the final layer and one or more previous or underlining layers. These implementations may be advantageous to distribute the overlay penalty over more layers (e.g., layer N−1 of wafer 1, layer N of wafer 2) than only over the layers immediately adjacent to the final layer (e.g., layer N of wafer 1) of each wafer. As such, these implementations may allow the wafer grid originally optimized for overlay between internal layers to be gradually changed to the wafer grid optimized for overlay between the interface layers of the two bonded wafers.

As can be seen in equations [8] and [11], embodiments of the alignment optimization may use an estimation of the bonding overlay between the interface layers of the two bonded wafers. In any of the above implementations, the bonding overlay may be estimated or predicted solely based on the wafer distortion information of one wafer (e.g., wafer 1) on which the alignment optimization is to be performed. In other words, the alignment optimization as described in any of the above implementations does not take into consideration of the distortion information of the other wafer (e.g., wafer 2). In different implementations, the bonding overlay may be estimated or predicted using the distortion information of both wafers (e.g., wafer 1 and wafer 2). Using the distortion information of two wafers rather than one wafer may lead to more accurate estimation of the bonding overlay and thus better distribution of the overlay penalty.

In other implementations, the alignment optimization as described mathematically in equation [21] or [24] may be used for better overlay control. Where there is a systematic overlay penalty in a wafer, the alignment optimization may be used to optimally distribute such a systematic overlay penalty between different layers of the wafer. The systematic overlay penalty may be regarded as the bonding overlay penalty and the alignment optimization may be implemented to spread the systematic overlay penalty over different layers in substantially the same way as to spread the bonding overlay penalty over different layers in wafer bonding use cases.

Note that the proposed method is not limited to determining a process correction for the wafer bonding use cases only. The proposed method may be applicable for determining a process correction for at least a first process of a lithographic process comprising at least the first process performed on at least a first substrate using at least a first apparatus and a second process performed on at least said first substrate using at least a second apparatus, where a correction actuation capability of the first apparatus differs from the second apparatus.

A solution for polynomial basis functions $f_i(x_{nom}, y_{nom})$ will now be described. The x-/y-direction squared overlay penalty matrix $R_{p,x/y}$ for a polynomial model may be calculated, for example, by inserting the polynomial model in the squared overlay penalty integral:

$$\sigma_{x/y}(f_{x/y}(p))^2 = \iint_{wafer} (f_{x/y}(p))^2 dx_{nom}dy_{nom} \tag{13}$$

$$= \int_{-r_w}^{r_w} \int_{-\sqrt{r_w^2-y_{nom}^2}}^{+\sqrt{r_w^2-y_{nom}^2}} \left( \sum_i p_{x/y,i} x_{nom}^{n_i} y_{nom}^{m_i} \right)^2 dx_{nom}dy_{nom}$$

$$= \sum_i \sum_j p_{x/y,i} p_{x/y,j} Q_{n_i+n_j,m_i+m_j}$$

$$= p^T R_{p,x/y} p,$$

where:

$$p = \begin{bmatrix} p_x \\ p_y \end{bmatrix}, \tag{14}$$

$$p_{x/y} = \begin{bmatrix} p_{x/y,1} \\ \vdots \\ p_{x/y,n} \end{bmatrix}, \tag{15}$$

$n$ is the number of parameters (assuming polynomial order $_o$:n=(o+1)(o+2)/2).

$r_w$ is the wafer radius.

$n_i/m_i$ are the x- and y-direction power of the $i^{th}$ basis functions.

$$R_{p,x} = \begin{bmatrix} R_p & 0 \\ 0 & 0 \end{bmatrix}, \tag{16}$$

$$R_{p,y} = \begin{bmatrix} 0 & 0 \\ 0 & R_p \end{bmatrix}, \tag{17}$$

$R_p$ is a matrix whose elements $R_{p,ij}$ are given by:

$$R_{p,ij} = Q_{n_i+n_j, m_i+m_j}, \tag{18}$$

and $Q_{n,m}$ is given by:

$$Q_{n,m} = \int_{-r_w}^{r_w} \int_{-\sqrt{r_w^2 - y_{nom}^2}}^{+\sqrt{r_w^2 - y_{nom}^2}} x_{nom}^n y_{nom}^m \, dx_{nom} \, dy_{nom} \tag{19}$$

$$= \frac{r_w^{n+m+2} [1 + (-1)^n][1 + (-1)^m]}{4} \frac{\Gamma\left(\frac{n+1}{2}\right)\Gamma\left(\frac{m+1}{2}\right)}{\Gamma\left(\frac{n+m+4}{2}\right)}.$$

With respect to determining the conversion matrix described above, the goal is to find the fit parameters for the subspace model which provide the best fit to a polynomial model evaluation over the entire wafer area. The conversion of the model parameters to the subspace model parameters may be achieved by defining a cost function J from the residuals of such a fit. Since the four-parameter actuation model is a subspace of the polynomial model, each of the four parameters (e.g., translations in x- and y-direction, rotation, and magnification) can be written as a linear combination of the polynomial model basis functions. Using this property, J can be written as:

$$J = \int_{-r_w}^{r_w} \int_{-\sqrt{r_w^2 - y_{nom}^2}}^{+\sqrt{r_w^2 - y_{nom}^2}} \left( \sum_i p_{x,i} x_{nom}^{n_i} y_{nom}^{m_i} - \sum_{k=1}^{4} c_k \sum_l S_{lkx} x_{nom}^{n_l} y_{nom}^{m_l} \right)^2 + \dots \tag{20}$$

$$\left( \sum_i p_{y,i} x_{nom}^{n_i} y_{nom}^{m_i} - \sum_{k=1}^{4} c_k \sum_l S_{lky} x_{nom}^{n_l} y_{nom}^{m_l} \right)^2 dx_{nom} dy_{nom}$$

$$= \sum_i \sum_j p_{x,i} p_{x,j} Q_{n_i+n_j, m_i+m_j} +$$

$$\sum_{k=1}^{4} \sum_{q=1}^{4} c_k c_q \sum_l \sum_p S_{lkx} S_{pqx} Q_{n_l+n_p, m_l+m_p} -$$

-continued $$2 \sum_i p_{x,i} \sum_{k=1}^{4} c_k \sum_l S_{lkx} Q_{n_i+n_l, m_i+m_l} + \dots ,$$

$$\sum_i \sum_j p_{y,i} p_{y,j} Q_{n_i+n_j, m_i+m_j} +$$

$$\sum_{k=1}^{4} \sum_{q=1}^{4} c_k c_q \sum_l \sum_p S_{lky} S_{pqy} Q_{n_l+n_p, m_l+m_p} -$$

$$2 \sum_i p_{y,i} \sum_{k=1}^{4} c_k \sum_l S_{lky} Q_{n_i+n_l, m_i+m_l}$$

$$= p^T R p + c^T S^T R S c - 2 c^T S^T R p$$

in which, $$R = \begin{bmatrix} R_p & 0 \\ 0 & R_p \end{bmatrix}, \tag{21}$$

$R_p$ may be defined in equation [18], $$c = \begin{bmatrix} c_1 \\ c_2 \\ c_3 \\ c_4 \end{bmatrix} = \begin{bmatrix} T_x \\ T_y \\ M\cos(R) \\ M\sin(R) \end{bmatrix}, \tag{22}$$

and S is the four-parameter subspace matrix that defines the four-parameter actuation model as a subspace of the polynomial model.

Once the cost function J is defined, the next step is to find the four parameters $_c$ that minimize the cost function by setting the gradient of J towards $_c$ to zero:

$$\frac{\partial J}{\partial c} = 0 \rightarrow 2S^T R S c - 2S^T R p = 0, \tag{23}$$

and solving for $_c$ resulting in:

$$c = (S^T R S)^{-1} S^T R p = M_{conv,4par} p. \tag{24}$$

The last step is to transform $_c$ to $p_{4par}$, which are the same model parameters, but defined in the full polynomial basis:

$$p_{4par} = S(S^T R S)^{-1} S^T R p = M_{conv,4par} p. \tag{25}$$

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc. In that regard, the processed "substrates" may be semiconductor wafers, or they may be other substrates, according to the type of product being manufactured.

Although specific reference may be made in this text to embodiments in the context of a lithographic apparatus, embodiments may be used in other apparatus. Embodiments may form part of a patterning device inspection apparatus, a metrology apparatus, or any apparatus that measures or processes an object such as a wafer (or other substrate) or a mask (or other patterning device). These apparatuses may be generally referred to as lithographic tools. Such a lithographic tool may use vacuum conditions or ambient (non-vacuum) conditions.

In the present document, the terms "radiation" and "beam" are used to encompass all types of radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Although specific reference may have been made above to the use with optical lithography, it will be appreciated that the embodiments, where the context allows, is not limited to optical lithography and may be used in other applications, for example imprint lithography.

The terms "optimizing" and "optimization" as used herein refers to or means adjusting an apparatus (e.g., a lithography apparatus), a process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In some embodiments, optimization steps can be applied iteratively to provide further improvements in one or more metrics.

Embodiments of the present disclosure can be implemented in any convenient form. For example, some embodiments may be implemented by one or more appropriate computer programs which may be carried on an appropriate carrier medium which may be a tangible carrier medium (e.g. a disk) or an intangible carrier medium (e.g. a communications signal). Embodiments of the present disclosure may be implemented using suitable apparatus which may specifically take the form of a programmable computer running a computer program arranged to implement a method as described herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing." "computing." "calculating." "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

Embodiments of the present disclosure can be further described by the following clauses.

1. A method for determining a process correction for at least a first process of a lithographic process, said lithographic process comprising at least the first process performed on at least a first substrate using at least a first apparatus and a second process performed on at least said first substrate using at least a second apparatus, where a correction actuation capability of the first apparatus differs from the second apparatus, the method comprising:
obtaining metrology data relating to said first substrate;
modeling said metrology data using a first model, said first model being related to said first apparatus; and
controlling said first process based on the modeled metrology data;
wherein said modeling step and/or an additional processing step comprises distributing a penalty in a performance parameter across said first process and said second process such that the distributed penalties in the performance parameter for said first process and said second process are within their respective specifications of the performance parameter.

2. A method as in clause 1, wherein said modeling step and/or said additional processing step further comprises fitting the first model to the metrology data so as to generate a first set of model parameters.

3. A method as in clause 2, wherein said fitting is a least squares fitting.

4. A method as in any preceding clause, wherein said distributing a penalty comprises optimizing a cost function comprising a sum of a penalty in the performance parameter for the first process and a penalty in the performance parameter for the second process.

5. A method as in clause 4, wherein said cost function comprises a sum of each of said penalties per direction of a substrate plane.

6. A method as in clause 4 or 5, wherein said sum is a weighted sum, and the method comprises determining the weights for said weighted sum based on required specifications for the performance parameter.

7. A method as in any of clauses 4 to 6, wherein said modeling step and/or an additional processing step comprises modifying said first set of model parameters to obtain a modified set of model parameters; and
determining the penalty in said performance parameter for said first process based on a deviation from said first set of model parameters when applying said modified set of model parameters to said first model.

8. A method as in clause 7, wherein said modeling step and/or said additional processing step further comprises mapping the first set of model parameters to said modified set of model parameters using a model mapping matrix.

9. A method as in clause 8, wherein said mapping is a linear mapping.

10. A method as in clause 8 or 9, wherein said modeling step and/or said additional processing step further comprises calculating the model mapping matrix.

11. A method as in any of clauses 7 to 10, wherein said modeling step and/or said additional processing step further comprises determining the process correction using the modified set of model parameters.

12. A method as in any of clauses 4 to 11, comprising determining the penalty in said performance parameter for said second process based on the difference of said modified set of model parameters and a converted set of model parameters that is calculated with a conversion matrix that converts said modified set of model parameters into a second set of model parameters to the model basis functions of said first model, said second set of model parameters being related to a second model which is related to the second apparatus.

13. A method as in clause 12, wherein the second model is a subspace of said first model.

14. A method as in clause 12 or 13, comprising determining said conversion matrix by determining said second set of model parameters which best fit said modified set of model parameters when evaluated over the entire first substrate area.

15. A method as in clause 2 or 3, wherein said fitting step comprises imposing a regularization based on an estimated penalty in said performance parameter for said second process.

16. A method as in clause 15, wherein said regularization is equal to said estimated penalty in said performance parameter for said second process.

17. A method as in clause 15 or 16, wherein said penalty in said performance parameter for said second process is estimated based on the difference of said first set of model parameters and a set of converted model parameters that are calculated with a conversion matrix that converts said first model parameters into a second set of model parameters to the model basis functions of said first model, said second set of model parameters being related to a second model which is related to the second apparatus.

18. A method as in clause 17, wherein the second model is a subspace of said first model.

19. A method as in any of clauses 15 to 18, wherein said fitting step comprises minimizing a cost function comprising first model residuals of said metrology data and said an estimated penalty in said performance parameter for said second process.

20. A method as in clause 19, wherein said cost function is a weighted cost function, the weights for said weighted cost function being based on required specifications for the performance parameter.

21. A method as in clause 20, wherein said fitting is a weighted least squares fit of the first model to the metrology data, said weighted least squares fit being weighted in a first direction and second direction of a substrate plane for the first process.

22. A method as in clause 19, 20 or 21, wherein the cost function comprises the sum of the regularization and the first model residuals of said metrology data.

23. A method as in any preceding clause, wherein the first model is a polynomial model.

24. A method as in any preceding clause, wherein said metrology data comprises alignment data for the first process and said first model comprises an alignment model.

25. A method as in any preceding clause, wherein the second apparatus is a lithographic exposure apparatus and the second process is a lithographic exposure process.

26. A method as in clause 25, wherein the second process comprises exposing lithographically a layer on the first substrate.

27. A method as in any of clauses 1 to 24, wherein the second apparatus is a bonding apparatus and the second process is a bonding process for bonding said first substrate to a second substrate, subsequent to performance of said lithographic exposure process.

28. A method as in clause 27, wherein said metrology data relates to both of said first substrate and second substrate, and said distributing a penalty in a performance parameter across said first process and second process comprises distributing said penalties in the performance parameter for said first process over said first substrate and second substrate.

29. A method as in any preceding clause, wherein the first apparatus is a lithographic exposure apparatus and first process is a lithographic exposure process.

30. A method as in clause 29, wherein the first process comprises exposing lithographically a layer on the first substrate.

31. A method as in clause 30, wherein said metrology data relates to at least a final layer, said final layer being the final layer exposed on said first substrate prior to said second process.

32. A method as in clause 31, wherein said metrology data relates to one or more additional layers other than said final layer exposed on said first substrate, and said distributing a penalty in a performance parameter across said first process and said second process comprises distributing said penalties in the performance parameter for said first process over said one or more additional layers in addition to said final layer.

33. A method as in clause 30, wherein said distributing a penalty in a performance parameter across said first process and said second process is performed by determining an additional correction for combination with said process correction for said first process; and controlling said first process based on a combination of the process correction and the additional correction.

34. A method as in clause 33, wherein said process correction is determined from said metrology data relating to a final layer, said final layer being the final layer exposed on said first substrate prior to said second process and said additional correction is determined from said metrology data relating to one or more additional layers other than said final layer exposed on said first substrate.

35. A method as in clause 33 or 34, wherein said process correction is determined without consideration of said second process.

36. A method as in any preceding clause, wherein the step of controlling said first process comprises applying the process correction within the first apparatus so as to distribute the penalty in the performance parameter across said first process and said second process.

37. A method as in any preceding clause, wherein the performance parameter is overlay.

38. A computer program comprising program instructions operable to perform the method of any preceding clause, when run on a suitable apparatus.

39. A non-transient computer program carrier comprising the computer program of clause 38.

40. A processing arrangement comprising:
    the non-transient computer program carrier of clause 39; and
    a processor operable to run the computer program comprised on said non-transient computer program carrier.

41. A lithographic apparatus comprising:
    an alignment sensor;
    a patterning device support for supporting a patterning device;
    a substrate support for supporting a substrate; and
    the processing arrangement of clause 40.

42. A lithographic apparatus as in clause 41, wherein the alignment sensor is operable to measure the substrate to obtain said metrology data.

43. A lithographic apparatus as in clause 41 or 42, wherein the processing arrangement is further operable to determine corrections for control said patterning device and/or substrate support based on said the result of said process correction.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for determining a process correction for at least a first process of a lithographic process, said lithographic process comprising at least the first process performed on at least a first substrate using at least a first apparatus and a second process performed on at least said first substrate using at least a second apparatus, where a correction actuation capability of the first apparatus differs from the second apparatus, the method comprising:
    obtaining metrology data relating to said first substrate;
    modeling said metrology data using a first model, said first model being related to said first apparatus; and controlling said first process based on the modeled metrology data;

wherein said modeling and/or an additional processing comprises distributing a lithographic error penalty in a lithographic performance parameter across said first process and said second process such that distributed lithographic error penalties in the lithographic performance parameter for said first and second processes are within respective specifications of said first and second processes for the performance parameter.

2. The method of claim 1, wherein said modeling and/or said additional processing further comprises fitting the first model to the metrology data so as to generate a first set of model parameters.

3. The method of claim 1, wherein said distributing the lithographic error penalty comprises optimizing a cost function comprising a sum of a lithographic error penalty in the lithographic performance parameter for the first process and a lithographic error penalty in the lithographic performance parameter for the second process.

4. The method of claim 3, wherein said cost function comprises a sum of each of said lithographic error penalties per direction of a substrate plane.

5. The method of claim 3, wherein said sum is a weighted sum, and the method comprises determining the weights for said weighted sum based on required specifications for the lithographic performance parameter.

6. The method of claim 3, wherein said modeling and/or an additional processing comprises modifying said first set of model parameters to obtain a modified set of model parameters; and determining the lithographic error penalty in said lithographic performance parameter for said first process based on a deviation from said first set of model parameters when applying said modified set of model parameters to said first model.

7. The method of claim 6, wherein said modeling and/or said additional processing further comprises mapping the first set of model parameters to said modified set of model parameters using a model mapping matrix.

8. The method of claim 3, comprising determining the lithographic error penalty in said lithographic performance parameter for said second process based on the difference of said modified set of model parameters and a converted set of model parameters that is calculated with a conversion matrix that converts said modified set of model parameters into a second set of model parameters to the model basis functions of said first model, said second set of model parameters being related to a second model which is related to the second apparatus.

9. The method of claim 2, wherein said fitting comprises imposing a regularization based on an estimated lithographic error penalty in said lithographic performance parameter for said second process.

10. The method of claim 9, wherein said regularization is equal to said estimated lithographic error penalty in said lithographic performance parameter for said second process.

11. The method of claim 9, wherein said fitting comprises minimizing a cost function comprising first model residuals of said metrology data and said estimated lithographic error penalty in said lithographic performance parameter for said second process.

12. The method of claim 1, wherein said metrology data comprises alignment data for the first process and said first model comprises an alignment model.

13. The method of claim 1, wherein the second apparatus is a lithographic exposure apparatus and the second process is a lithographic exposure process.

14. The method of claim 1, wherein the second apparatus is a bonding apparatus and the second process is a bonding process for bonding said first substrate to a second substrate, subsequent to lithographic performance of said lithographic exposure process.

15. The method of claim 14, wherein said metrology data relates to both of said first substrate and second substrate, and said distributing the lithographic error penalty in the lithographic performance parameter across said first process and second process comprises distributing said lithographic error penalties in the lithographic performance parameter for said first process over said first substrate and second substrate.

16. The method of claim 1, wherein the first apparatus is a lithographic exposure apparatus and first process is a lithographic exposure process.

17. The method of claim 16, wherein the first process comprises exposing lithographically a layer on the first substrate.

18. The method of claim 17, wherein said metrology data relates to at least a final layer, said final layer being the final layer exposed on said first substrate prior to said second process.

19. The method of claim 18, wherein said metrology data relates to one or more additional layers other than said final layer exposed on said first substrate, and said distributing the lithographic error penalty in the lithographic performance parameter across said first process and said second process comprises distributing said lithographic error penalties in the lithographic performance parameter for said first process over said one or more additional layers in addition to said final layer.

20. The method of claim 1, wherein controlling said first process comprises applying the process correction within the first apparatus so as to distribute the lithographic error penalty in the lithographic performance parameter across said first process and said second process.

21. The method of claim 1, wherein the lithographic performance parameter is overlay.

22. A non-transitory computer readable medium comprising computer program instructions operable to perform the method of claim 1.

23. A processing arrangement comprising:

the non-transitory computer readable medium of claim 22; and a processor operable to run the computer program instructions comprised on said non-transitory computer readable medium.

24. A lithographic apparatus comprising:

an alignment sensor;

a patterning device support for supporting a patterning device;

a substrate support for supporting a substrate; and the processing arrangement of claim 23.

* * * * *